United States Patent
Fischer et al.

(10) Patent No.: US 6,734,891 B2
(45) Date of Patent: May 11, 2004

(54) METHOD FOR THE THERMAL STABILIZATION OF A LASER DIODE IN A RECORDER

(75) Inventors: Jörg-Achim Fischer, Laboe (DE); Klaus-Günter Leiss, Kiel (DE)

(73) Assignee: Heidelberger Druckmaschinen AG, Keil (DE)

( * ) Notice: Subject to any disclaimer, the term of this patent is extended or adjusted under 35 U.S.C. 154(b) by 0 days.

(21) Appl. No.: 10/034,050

(22) Filed: Dec. 20, 2001

(65) Prior Publication Data

US 2002/0113858 A1 Aug. 22, 2002

(30) Foreign Application Priority Data

Dec. 20, 2000 (DE) .......................................... 100 63 707

(51) Int. Cl.⁷ ................................................ B41J 2/435
(52) U.S. Cl. ...................................... 347/247; 347/237
(58) Field of Search ................................ 347/235, 236, 347/237, 246, 247, 255, 135, 132; 372/38.02, 38.1

(56) References Cited

U.S. PATENT DOCUMENTS

| 5,309,458 A | 5/1994 | Carl ............................ 372/34 |
| 5,341,156 A | 8/1994 | Eguchi ....................... 347/247 |
| 5,495,463 A | 2/1996 | Akagi et al. |
| 5,999,550 A | * 12/1999 | Bellemore et al. ....... 372/38.02 |
| 6,370,175 B1 | * 4/2002 | Ikeda et al. ................. 372/38.1 |

FOREIGN PATENT DOCUMENTS

| DE | 199 12 463 A1 | 9/2000 |
| EP | 0 963 016 A2 | 12/1999 |
| JP | 61165835 A | 7/1986 |
| JP | 63128371 A | 5/1988 |
| JP | 01084446 A | 3/1989 |

* cited by examiner

Primary Examiner—Hai Pham
(74) Attorney, Agent, or Firm—Laurence A. Greenberg; Werner H. Stemer; Ralph E. Locher

(57) ABSTRACT

A laser diode in a recorder is thermally stabilized. The laser diode is used to produce a light beam, which is modulated by superimposing a basic current and a modulation current derived from an image signal, and exposes a recording material point by point and line by line. Between the exposure periods, wherein in each case one line is exposed, there are return periods, wherein the light beam is guided to the start of the next line, and wherein the laser diode is modulated for the purpose of thermal stabilization. In the return period, the laser diode is modulated with the basic current during a stabilization period, the sum of the modulation times during the exposure period and during the stabilization period being constant. In addition, during the return period, the laser diode can be modulated with a modulation current, which is derived from the inverted image signal from the preceding or the following line.

12 Claims, 4 Drawing Sheets

METHOD FOR THE THERMAL STABILIZATION OF A LASER DIODE IN A RECORDER

BACKGROUND OF THE INVENTION

Field of the Invention

The invention relates to the field of electronic reproduction technology and relates to a method for the thermal stabilization of a laser diode in the point by point and line by line exposure of recording material by means of a light beam in an electronic exposing device, also referred to as an exposer, recorder, or image setter. A recorder is used, in particular, to expose printing forms, that is to say films or printing plates, which contain all the text, graphics and image elements of a page to be printed. In the case of multicolor printing, a separate printing form is exposed for each printing color.

In a recorder, a light beam that is modulated by an image signal is guided point by point and line by line over the recording material to be exposed. The recording material is thereby fixed on a holder which moves relative to the light beam. In the case of an internal drum appliance, the recording medium is fixed onto a holder shaped like a segment of a cylinder or an exposure trough, and the light beam is guided over the recording material point by point and line by line by means of a rotating light beam deflection device. However, the recorder can also be constructed as an external drum apparatus or flat bed apparatus.

The light source often used to produce the light beam is a laser diode, which is modulated with the image signal. In conventional printing technology, different densities of a printing ink are produced by means of raster points of varying size, that is to say ink is either printed or not at each point on the printed page. The image signal therefore has only two signal values, namely, ink or no-ink or exposure or non-exposure. Accordingly, the laser diode is modulated during the exposure in such a way that it emits light for the image points to be exposed and does not emit light for the image points that are not to be exposed. Driving the laser diode by means of the image signal is carried out in the prior art in such a way that it is activated and modulated line by line within exposure time periods, during which the light beam sweeps over the lines to be exposed on the recording material, and is deactivated within return time periods, wherein the light beam is guided to the next line to be exposed.

A known problem in the case of exposure with a laser diode is that the light power emitted and also the wavelength change with the temperature of the laser diode. In this case, different time constants apply to the temperature change, very short time constants when the temperature of the PN junction in the laser diode changes very quickly as a result of the modulation current being switched on and off, medium time constants when the temperature of fittings of the laser diodes changes as a result of a varying medium current loading, and a long time constant if, for example, the ambient temperature changes. As a rule, the short, medium, and long time constants cannot be delimited clearly, instead there is a sliding transition between the temperature dependencies with different time constants. In the individual case, this depends to a great extent on the construction of the laser diode, that is to say on the mechanical-thermal attachment of the laser chip to a carrier plate and the thermal coupling via further fittings as far as the housing. In addition, the temperature time constants are influenced by the design configuration of the installation of the laser diode in the recorder, the dissipation of heat via the components of the recorder and the ventilation.

In order to expose printing forms, a constant light power is imperative, since fluctuations in the light power manifest themselves in undesirable stripes, patterns, and the like in the finally exposed printing form. Furthermore, a wavelength which changes as a result of temperature fluctuations can also bring about similar disruptive patterns, depending on the relationship between the exposure sensitivity of the recording material and the wavelength of the light.

In order to compensate for very short-term power fluctuations, which occur as a result of the temperature change of the PN junction of the laser diode during a single modulation pulse, a method is known wherein the drop in power caused by the increase in temperature or the increase in power caused by a reduction in temperature is compensated for by means of an additional correction current. In this case, the time variation of the power change is compensated for by an appropriate opposite variation in the correction current, the time variation being simulated by a resistance-capacitance network in the current generator for the correction current. Such a method is described in U.S. Pat. No. 5,309,458.

In order to compensate for power fluctuations with medium and long time constants, according to the prior art, control of the light power is used, part of the light beam being coupled out of the exposure beam path and deflected onto a light sensor. The light power measured by the light sensor is input as a measured variable into a control loop, which controls the power of the laser diode to a predefined value. To this end, for example during a control phase before each modulation phase, the light power at a predefined laser diode current is measured and the laser power is controlled. Such a method is described in U.S. Pat. No. 5,495,463.

The control method is primarily suitable to compensate for relatively slow temperature changes from modulation phase to modulation phase. In the case of a recorder for printing forms, a line to be exposed corresponds to one modulation phase. The control method is able to intervene and compensate for deviations only before each line to be exposed. In addition, the control method is complicated to implement, particularly if the intention is also to control out power fluctuations from line to line, which are brought about by the number, which depends on the image content, and also by the distribution, which varies within the lines, of the image points to be exposed. The correction current method is suitable only for very short power fluctuations within the time range of one or a few image points, and cannot therefore compensate for the power fluctuations with a medium time constant.

SUMMARY OF THE INVENTION

It is accordingly an object of the invention to provide a method of thermally stabilizing a laser diode in a recorder, which overcomes the above-mentioned disadvantages of the heretofore-known devices and methods of this general type and which improves a method of exposing recording material with the laser diode in such a way that thermal stabilization of the laser diode power in the range of medium time constants is achieved in a simple way.

With the foregoing and other objects in view there is provided, in accordance with the invention, a method for thermal stabilization of a laser diode in a recorder, which comprises:

modulating a laser diode by superimposing a basic current and a modulation current and generating a modulated light beam with a laser diode;

exposing recording material point by point and line by line with the modulated light beam, during exposure periods, wherein a respective line is exposed, and return periods, wherein the light beam is guided to a start of a respectively next line; and thereby modulating the laser diode within the return period.

In accordance with an added feature of the invention, the laser diode is modulated with the basic current during a stabilization period.

In accordance with an additional feature of the invention, the sum of the modulation times with the basic current during the exposure period and during the stabilization period is constant.

In accordance with another feature of the invention, the sum of the modulation times with the basic current during the exposure period and during the stabilization period corresponds to the maximum line length that can be exposed.

In accordance with a further feature of the invention, before the first line is exposed, the laser diode is modulated with the basic current during the stabilization period.

In accordance with again an added feature of the invention, in a start/stop operating mode of the recorder the laser diode is modulated with the basic current during the stabilization period during a stop phase and a restarting phase.

In accordance with again an additional feature of the invention, during the return period, the laser diode is additionally modulated with a modulation current.

In accordance with again another feature of the invention, the modulation current is derived from the inverted image signal from the preceding or the following line.

In accordance with again a further feature of the invention, the modulation current is lengthened to the maximum possible line length by an appended signal component.

In accordance with yet a further feature of the invention, the appended signal component is shortened by a proportion of the time which corresponds to the emitted light power from the laser diode during the exposure period and the stabilization period.

In accordance with a concomitant feature of the invention, the recorder is an internal drum recorder.

Other features which are considered as characteristic for the invention are set forth in the appended claims.

Although the invention is illustrated and described herein as embodied in a method for the thermal stabilization of a laser diode in a recorder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
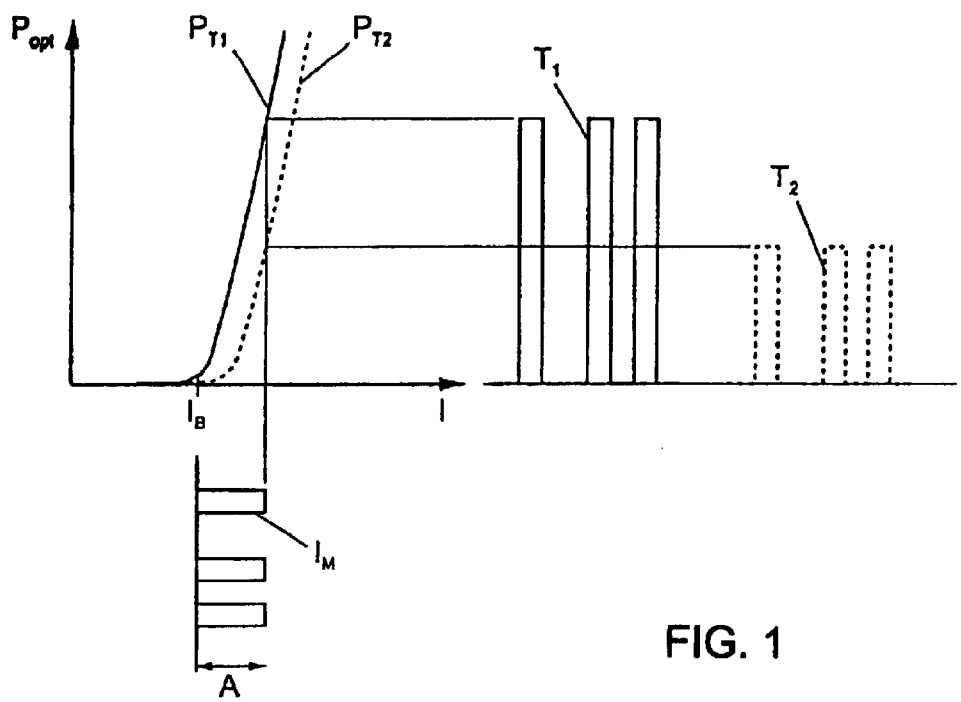
FIG. 1 is a power/current graph illustrating the modulation of a laser diode according to the invention.

Referring now to the figures of the drawing in detail and first, particularly, to FIG. 1 thereof, there is illustrated the modulation of a laser diode in a current-power graph, wherein the optical output power $P_{opt}$ of a laser diode is plotted as a function of the diode current I. FIG. 1 shows a first curve $P_{T1}(I)$ for a temperature $T_1$ and a second curve $P_{T2}(I)$ for a temperature $T_2 > T_1$. The curves show the typical response of a laser diode, that is to say light power is only emitted above a threshold current, and the light power then rises sharply as the current increases further. At the higher temperature $T_2$, the emission of the light power is established only at a higher threshold current, that is to say the curve $P_{T2}(I)$ is essentially shifted with respect to the curve $P_{T1}(I)$. The modulation of the laser diode is normally carried out by superimposing a basic current $I_B$ and a modulation current $I_M$. In the specific application wherein a printing form is exposed, the modulation current is a square-wave pulse train with the amplitude A, which reproduces the image signal of the image points to be exposed and not to be exposed. FIG. 1 shows that, for the temperature $T_1$, a high light power of the output pulses is obtained, and a lower light power is obtained for the higher temperature $T_2$.

Figure 2:
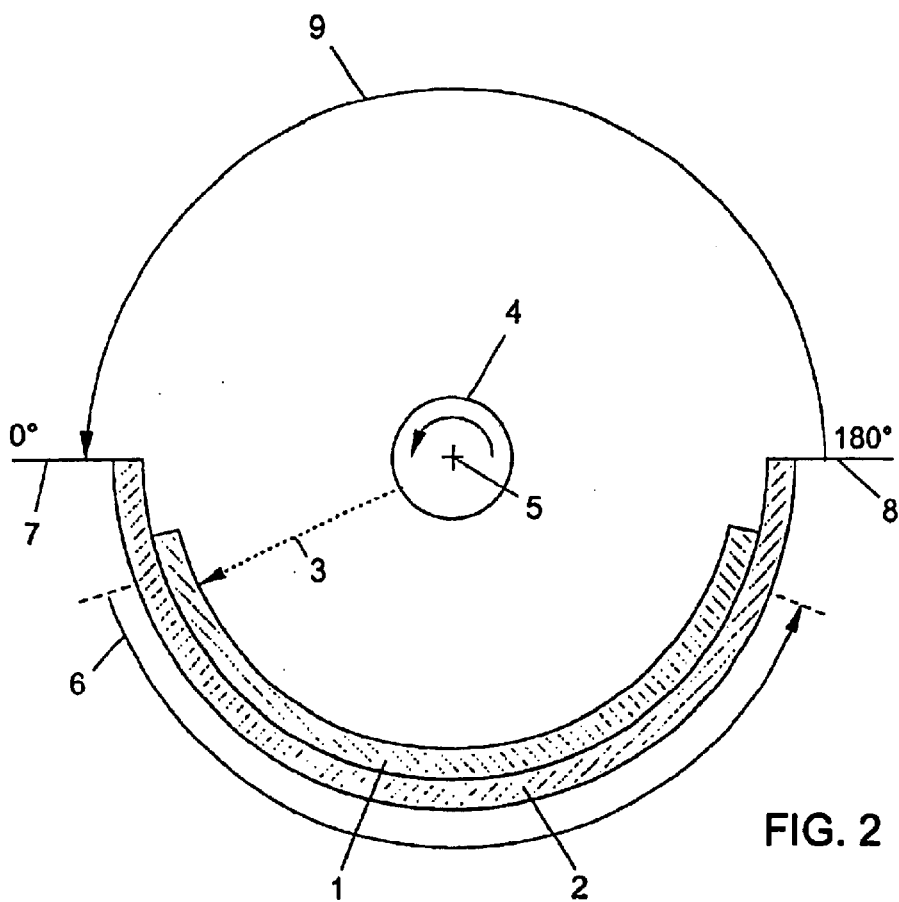
FIG. 2 is a diagrammatic sectional side view of an exposing device of the internal drum type.

Referring now to FIG. 2, there is shown a section of an exposing device which operates on the internal drum principle. Recording material 1 is fixed on the inner surface of a stationary holder shaped like a segment of a cylinder or an exposure trough 2 having an opening angle of, say, 180°. The light beam 3, produced by a laser diode, is deflected by means of a rotating light beam deflection device 4 in the direction of an arrow (line direction) on a circular path point by point and line by line over the recording material 1. The laser diode is modulated by the superimposition of the basic current $I_B$ and the modulation current $I_M$, and the light beam deflection device 4 moves in the direction of the axis 5 of the cylinder, perpendicularly to the plane of the drawing (advance direction). The light beam deflection device 4 is preferably a mirror which is oriented at an angle to the axis 5 of the cylinder and rotates about the axis 5 of the cylinder. Inside the exposure trough 2, an exposure area 6 extends over the recording material 1. In each exposure period (line), the exposure area 6 identifies the exposure period or modulation period, during which the light beam 3 performs the exposure of one line on the recording material 1. The exposure area 6 is given by the length of the line of the printing form to be exposed and, depending on the format of the printed page, can be smaller than the available width of the recording material. The exposure area 6 begins after a starting mark 7 at the opening angle 0° and ends before an end mark 8 at the opening angle 180°. A return area 9, which begins at the end mark 8 and ends at the starting mark 7 in the case of the arrow direction shown, identifies the return period, during which no exposure takes place and the light beam 3 is in each case guided to the next line.

Temperature stabilization in accordance with the invention will be explained in more detail below.

Figure 3:
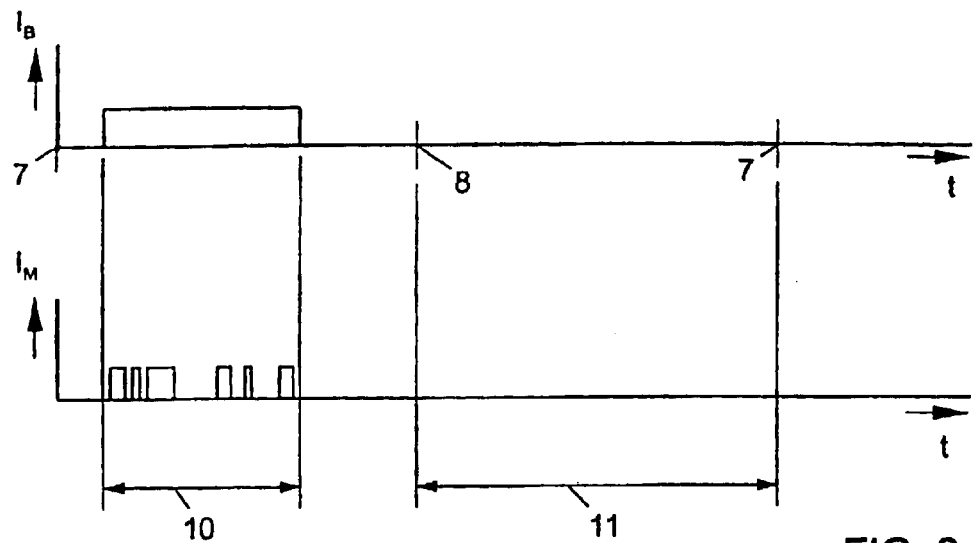
FIG. 3 are timing diagrams for the basic current and the modulation current according to the prior art.

FIG. 3 shows timing diagrams to illustrate the time variation of the basic current $I_B$ and the modulation current $I_M$ according to the prior art, without the temperature stabilization according to the invention. In the time interval during which the light beam 3 is located between the starting mark 7 and the end mark 8, the basic current $I_B$ is switched on during an exposure period 10, during which the light beam is located in the exposure area 6. In addition, the modulation current $I_M$ derived from the image signal is superimposed. The basic current $I_B$ is only switched on during the exposure period 10, since the laser diode can also already emit a small amount of light power at the basic current. If the basic current were to be switched on outside the exposure period 10, undesired exposure of the recording medium 1 outside the printing form format could take place.

In the time interval during which the light beam 3 is located between the end mark 8 and the starting mark 7, that is to say in the return period 11 which corresponds to the return area 9, neither the basic current $I_B$ nor the modulation current $I_M$ are switched on, according to the prior art. As a result, the operating temperature of the laser diode decreases during the return period 11.

Figure 4:
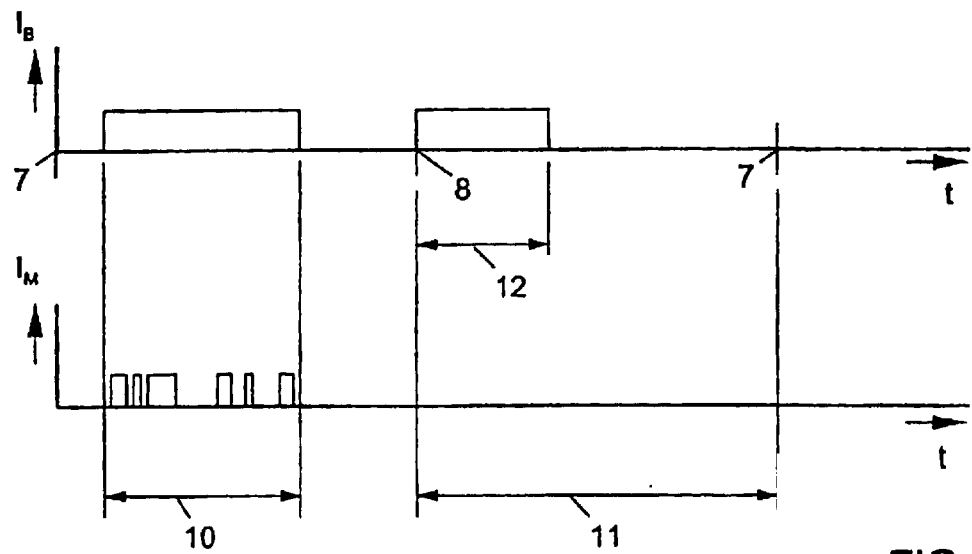
FIG. 4 are timing diagrams for the basic current and the modulation current according to the invention.

FIG. 4 shows timing diagrams to illustrate the thermal stabilization of the laser diode in accordance with the method of the invention. Within the return period 11, a stabilization period 12 is provided, wherein the basic current $I_B$ is additionally switched on, in order to heat the laser diode during the return period 11 as well and to avoid the decrease in temperature. Although the laser diode emits no optical power or only a very small amount of optical power at the basic current $I_B$ on its own, nevertheless a power loss is absorbed, which is substantially equal to the total power determined by the current and voltage across the diode and which heats the laser diode. The optical power $P_{opt}$ emitted and illustrated in FIG. 1 is only a small fraction of the total power absorbed in the case of typical laser diodes. The length of the stabilization period 12 is preferably selected such that the sum of the exposure period 10 and stabilization period 12 remains constant for all line lengths which result from the different formats of the exposed printing forms, for example corresponds to the maximum possible line length. This means that for a printing form with a long line length, the stabilization period 12 will be selected to be correspondingly shorter than for a printing form with a short line length. As a result, the basic current is always switched on for the same time during a complete revolution of the light beam deflection device 4, irrespective of the format of the exposed printing form, by which means the operating temperature of the laser diode is stabilized. In practice, however, exact constancy of the duty cycle of the basic current is often not necessary for adequate stabilization of the operating temperature.

As distinct from the time variation shown in FIG. 4, the chronological position of the stabilization period 12 within the return period 11 can also be varied.

Figure 5:
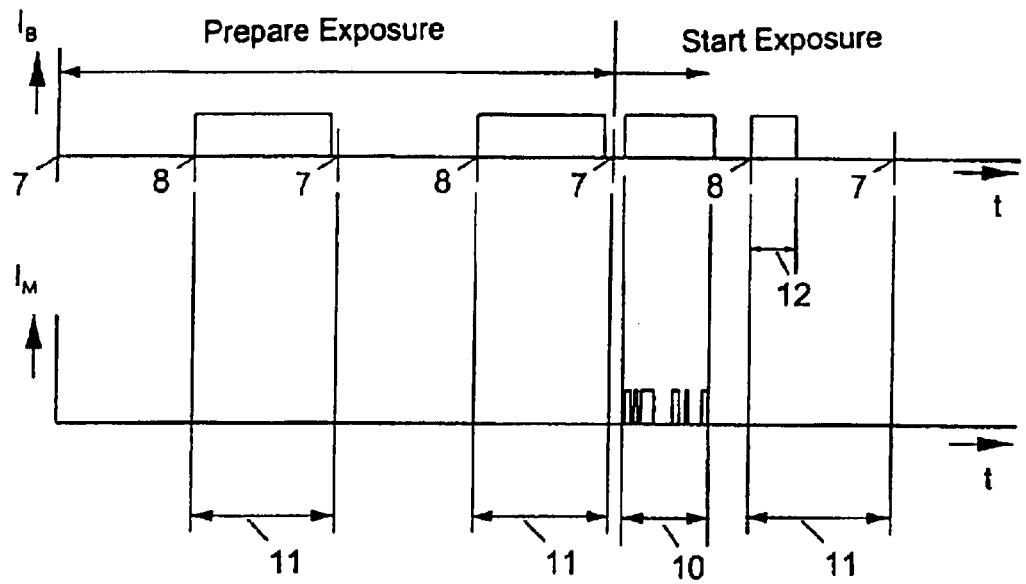
FIG. 5 are timing diagrams for the basic current and the modulation current during exposure preparation and during exposure.

According to a further feature of the invention, the basic current $I_B$ is already switched on before the first line of the printing form is exposed, in order to bring the laser diode to a predefined operating temperature. In an internal drum recorder, the light beam deflection device 4 is brought up to its intended rotational speed before the start of exposure, and the advance drive, which moves the light beam deflection device 4 along the axis 5 of the cylinder, is brought to its intended speed. During this phase of exposure preparation, the basic current is switched on only during the return period 11, the duty cycle preferably being selected to correspond to the determined sum of exposure period 10 and stabilization period 12, that is to say, for example, corresponding to the maximum possible line length. FIG. 5 shows the time sequence in this regard. With the exposure of the first line, the duty cycle of the basic current $I_B$ is then distributed to the exposure period 10 and the stabilization period 12 in accordance with the time variation shown in FIG. 4. Switching on the basic current as early as during the exposure preparation means that the laser diode is already in thermal equilibrium at the start of the exposure.

According to the invention, the same measure is applied when the recorder operates in start/stop operation, as it is known. A recorder must always be operated in start/stop operation when it is not ensured that the computer which is present to condition the image signal, also referred to as a raster image processor (RIP), is able to make the image signal for the modulation of the light beam available continuously at the necessary speed. If delays occur in providing the image signal for the following lines to be exposed, the advance drive of the recorder is stopped until the image signal for the following lines is available. It is then necessary for the advance drive to move back a little and start up again, because of the inertia of the masses to be moved, until it has been brought to its intended speed. During the stopping phase and the restarting phase, the basic current $I_B$ is switched on only during the return period 11 and then for a correspondingly longer time, in order to keep the laser diode in thermal equilibrium during the waiting time. The complete displacement of the basic current into the return period 11 prevents the small light power from the laser diode, possibly also emitted at the basic current, being accumulated during the stopping phase and leading to exposure of the recording material.

Figure 6:
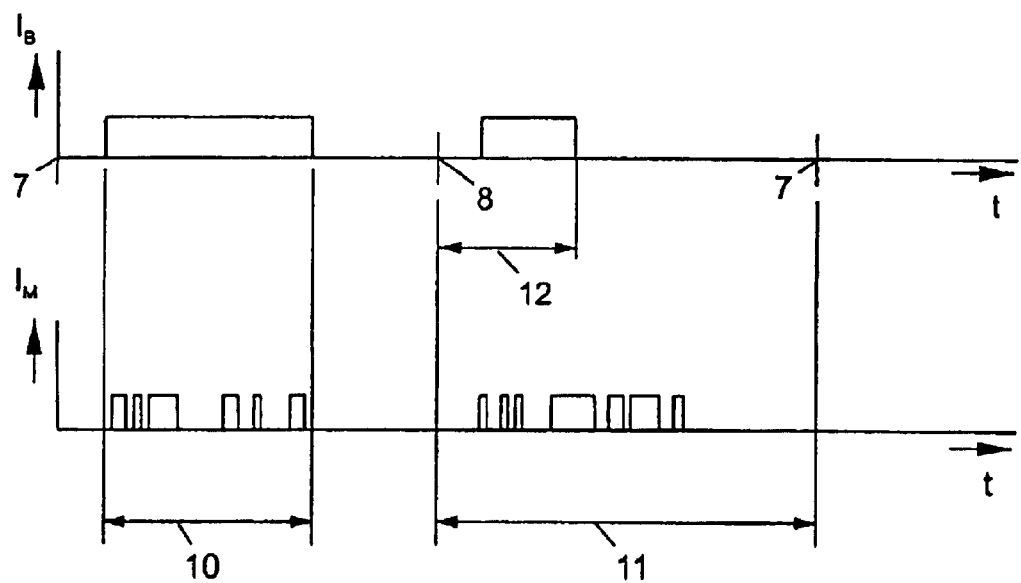
FIG. 6 are timing diagrams for the basic current and the modulation current according to a further embodiment of the invention.

According to a further feature of the invention, the thermal stabilization of the laser diode can be improved still further if, during the return period 11, the modulation current $I_M$ is additionally switched on as well. In this case, the laser diode is preferably modulated with the inverted image signal from the preceding line or the following line. FIG. 6 shows the time sequence in this regard. Modulation with the inverted image signal means that during a complete revolution of the light beam deflection device 4 the laser diode carries the basic current $I_B$ and the maximum current $I_{MAX} = I_B + A$ during equally long proportions of the time. As a result, the power consumption of the laser diode is constant during a complete revolution of the light beam deflection device 4, irrespective of the form of the modulation current $I_M$, that is to say irrespective of the image content of the exposed line.

Figure 7:
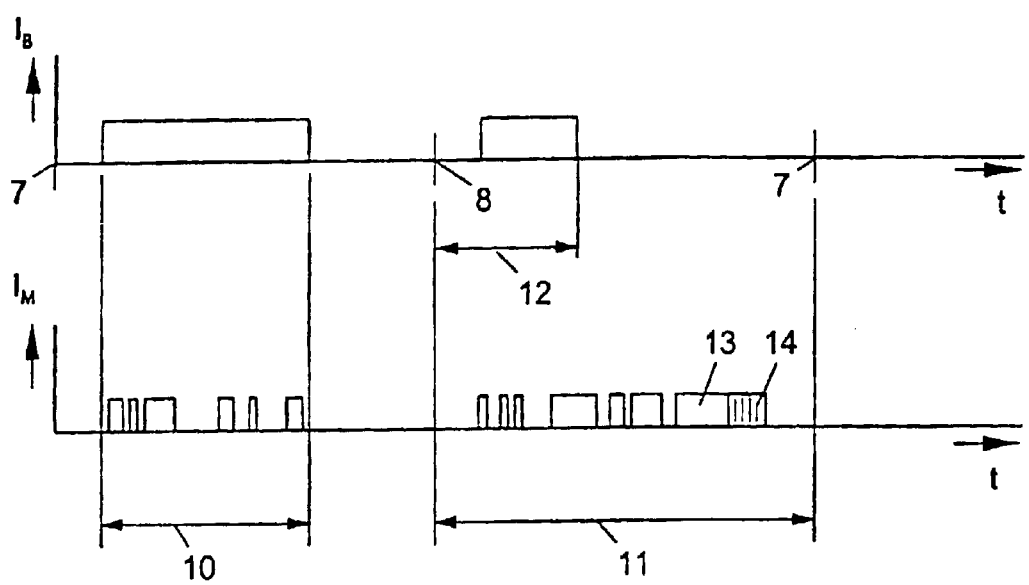
FIG. 7 are timing diagrams for the basic current and the modulation current for yet a further embodiment of the invention.

FIG. 7 shows a variant of this principle. Here, the modulation current $I_M$ has been lengthened to the maximum possible line length, by the signal component 13 having been appended. Here, too, the power consumption of the laser diode is constant during a complete revolution of the light beam deflection device 4, irrespective of the form of the modulation current $I_M$, but has a higher value than in the variant according to FIG. 6. The effect of the variant according to FIG. 7 can be optimized still further if the appended signal component 13 is shortened by a proportion 14 of the time, which compensates for the light power emitted during the exposure period 10 and the stabilization period 12. Since the thermal power loss is equal to the total power consumed minus the emitted light power, the thermal power loss is then constant during a complete revolution of the light beam deflection device 4.

We claim:

1. A method for thermal stabilization of a laser diode in a recorder, which comprises:

modulating a laser diode by superimposing a basic current and a modulation current and generating a modulated light beam with a laser diode;

exposing recording material point by point and line by line with the modulated light beam, during exposure periods, wherein a respective line is exposed, and return periods, wherein the light beam is guided to a start of a respectively next line; and modulating the laser diode during partial time periods within the return period.

2. The method according to claim 1, which comprises modulating the laser diode with the basic current during a stabilization period being part of the return period.

3. The method according to claim 2, wherein a sum of modulation times with the basic current during the exposure period and during the stabilization period is constant.

4. The method according to claim 3, wherein the sum of the modification times with the basic current during the exposure period and during the stabilization period corresponds to the maximum line length that can be exposed.

5. The method according to claim 1, which comprises modulating the laser diode with the basic current during a stabilization period being part of the return period, before a first line is exposed.

6. The method according to claim 1, which comprises operating a recording in a start/stop operating mode, and thereby modulating the laser diode with the basic current during a stabilization period being part of the return period, during a stop phase, and during a restarting phase.

7. The method according to claim 1, which comprises additionally modulating the laser diode with a modulation current during the return period.

8. The method according to claim 7, which comprises deriving the modulation current from an inverted image signal from a preceding or following line.

9. The method according to of claim 8, which comprises lengthening the modulation current to a maximum possible line length with an appended signal component.

10. The method according to of claim 7, which comprises lengthening the modulation current to a maximum possible line length with an appended signal component.

11. The method according to claim 10, which comprises shortening the appended signal component by a proportion of a time corresponding to an emitted light power from the laser diode during the exposure period and a stabilization period.

12. The method according to claim 1, wherein the recorder is an internal drum recorder and the exposing step comprises exposing the recording material in the internal drum recorder.

* * * * *